United States Patent [19]

Eskandari

[11] Patent Number: 5,522,225
[45] Date of Patent: Jun. 4, 1996

[54] THERMOELECTRIC COOLER AND TEMPERATURE SENSOR SUBASSEMBLY WITH IMPROVED TEMPERATURE CONTROL

[75] Inventor: Joseph Eskandari, Granada Hills, Calif.

[73] Assignee: Xerox Corporation, Stamford, Conn.

[21] Appl. No.: 358,494

[22] Filed: Dec. 19, 1994

[51] Int. Cl.$^6$ .............................. H01L 35/02; F25B 21/02
[52] U.S. Cl. .................................. 62/3.7; 136/230
[58] Field of Search ................. 62/3.2, 3.7; 136/203, 136/230, 231, 232, 242

[56] References Cited

U.S. PATENT DOCUMENTS

| | | | |
|---|---|---|---|
| 3,264,746 | 8/1966 | Pearse | 62/3.2 |
| 4,250,751 | 2/1981 | Holzhacker | 136/230 X |
| 4,460,802 | 7/1984 | Benedict et al. | 136/230 |
| 4,920,262 | 4/1990 | Aiki et al. | 250/227.11 |
| 5,056,929 | 10/1991 | Watanabe et al. | 374/181 |

*Primary Examiner*—Henry A. Bennett
*Assistant Examiner*—William C. Doerrler
*Attorney, Agent, or Firm*—Nola Mae McBain

[57] ABSTRACT

A thermoelectric cooler subassembly in which all connections between a thermister and the thermoelectric cooler are attached to a cold side of the thermoelectric cooler and avoid contact with a hot side of the thermoelectric cooler which reduces the sensing of the ambient temperature, as well as the hot side of the thermoelectric cooler, by the thermistor thereby providing a more accurate temperature control.

5 Claims, 2 Drawing Sheets

THERMOELECTRIC COOLER AND TEMPERATURE SENSOR SUBASSEMBLY WITH IMPROVED TEMPERATURE CONTROL

BACKGROUND

This invention relates generally to thermo electric coolers and temperature sensors and more particularly concerns a subassembly for a thermoelectric cooler and a temperature sensor which is easier to install, has fewer loose wires, better temperature maintenance and improved reliability.

Thermoelectric coolers are used in a wide variety of electronic applications where a component must remain either at a constantly maintained temperature or a specific temperature either warmer or cooler then the ambient temperature to work correctly. Thermoelectric coolers have a cold side and a hot side. A device to be either heated or cooled is put in contact with the cold side of the thermoelectric cooler while the hot side of the thermoelectric cooler is put in contact with a heat sink. If the device is to be cooled, the thermoelectric cooler removes heat from the device and adds heat to the heat sink. If the device is to be heated, the thermoelectric cooler removes heat from the heat sink and adds heat to the device. Thermoelectric coolers are often used with thermistors, which are used to sense temperatures and enable control of the thermoelectric cooler, commonly as an input to a thermoelectric cooler driver.

The thermoelectric cooler and the thermistor each have two wires that must be connected. The wires are fragile, difficult to handle, and susceptible to damage from handling because the wires can be as thin as 0.002 inches in diameter.

The thermistor is usually mounted on the cold side of the thermoelectric cooler or to a device being cooled. To properly regulate temperature, the thermistor must only sense the thermoelectric cooler cold side temperature or the device it is trying to cool, whichever it is mounted on. However, the electrical connection to the thermistor is through wires or pins at a substantially higher ambient temperature. As a result, the thermistor senses not only the cold side temperature of the thermoelectric cooler or device being cooled but also the higher ambient temperature through the thermal conduction of the wires or pins of the electrical connections. The thermistor as a result averages these two temperatures and sends a false feedback signal to the thermoelectric cooler driver. The overall result is an ambient dependent temperature control with a set point that varies according to changes in the ambient temperature. Tests of this phenomenon show this variation at between two degrees centigrade and seven degrees centigrade. In many cooling applications, variations of this magnitude are unacceptable.

In laser printing applications, thermoelectric coolers are used to cool laser diodes which have a strong temperature dependent optical power output. Variations as large as those cited cause unacceptable fluctuations in the ouput power of the laser diode. The unacceptable output power fluctuations in the laser diode cause additional expensive circuitry to be added to the system to maintain a constant optical power output from the laser diode.

Accordingly, it is the primary aim of the invention to provide a subassembly which reduces the sensing of the ambient temperature by the thermistor thereby providing a more accurate temperature control.

Further advantages of the invention will become apparent as the following description proceeds.

SUMMARY OF THE INVENTION

Briefly stated and in accordance with the present invention, there is provided a thermoelectric cooler assembly with two spaced apart ceramic plates, one of the plates called a hot side and the other of the ceramic plates called a cold side, with thermoelectric cooler elements interposed between the ceramic plates. Two conductive pins are attached to the cold side, extending through said cold side and extending through two holes in said hot side. The holes in the hot side have a diameter larger than the diameter of said two conductive pins attached to said cold side, so that the pins may pass through the holes without contacting the hot side and leaving a gap between the conductive pins and the hot side.

While the present invention will be described in connection with a preferred embodiment, it will be understood that it is not intended to limit the invention to that embodiment/procedure. On the contrary, it is intended to cover all alternatives, modifications and equivalents as may be included within the spirit and scope of the invention as defined by the appended claims.

| Alpha-Numeric List of Elements | |
|---|---|
| 40 | Thermoelectric cooler and thermistor subassembly |
| 42 | ceramic plate |
| 44 | solid metal pin |
| 46 | solid metal pin |
| 48 | pin |
| 50 | pin |
| 52 | thermoelectric cooler |
| 53 | thermoelectric elements |
| 54 | cold side |
| 56 | thermister |
| 58 | lead wires |
| 60 | insulating gap |
| 70 | circuit board |
| 72 | heat sinking plate |
| 74 | hole |
| 76 | hole |
| 78 | solder joints |

DETAILED DESCRIPTION OF THE INVENTION

Figure 1:
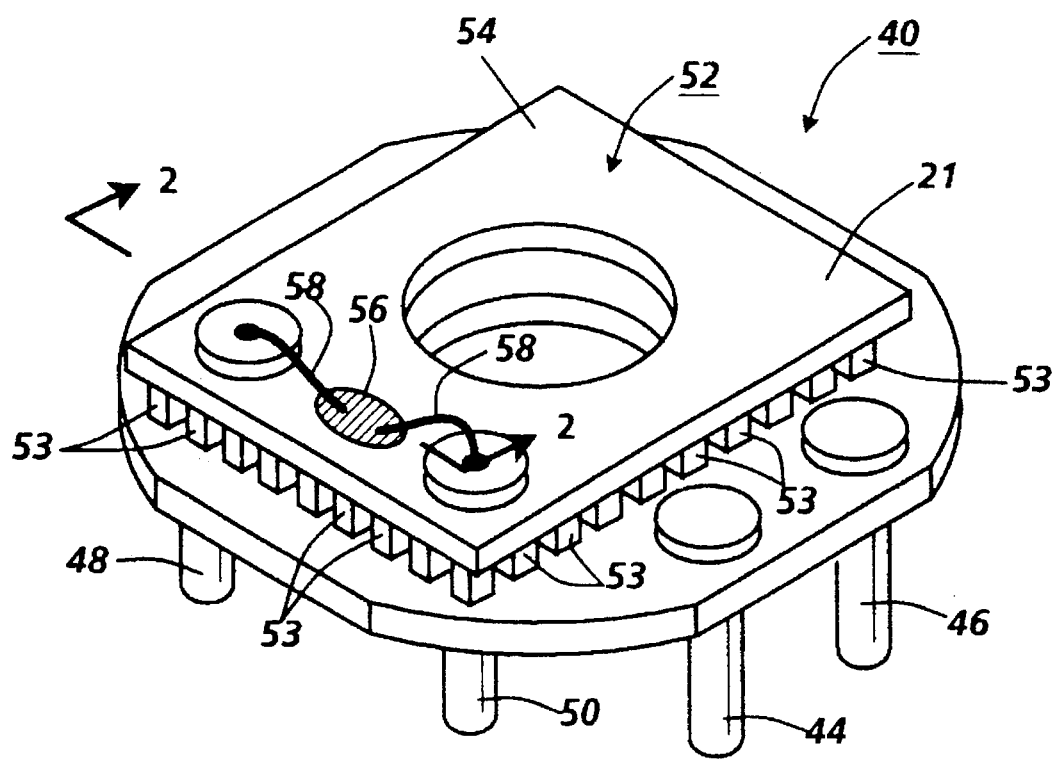
FIG. 1 is a perspective view of a thermoelectric cooler and thermistor subassembly.

FIG. 1 shows a thermoelectric cooler and thermistor subassembly 40. The thermoelectric cooler and thermistor subassembly 40 shown in FIG. 1 has a ceramic plate 42, solid metal pins 44, 46, thermoelectric cooler 52 with a cold side 54 and a thermister 56 attached to the cold side 54 by lead wires 58. Thermoelectric cooler elements 53 are between the ceramic plate 42 and the cold side 54. Pins 48, 50 are used to connect the thermister 56.

Figure 2:
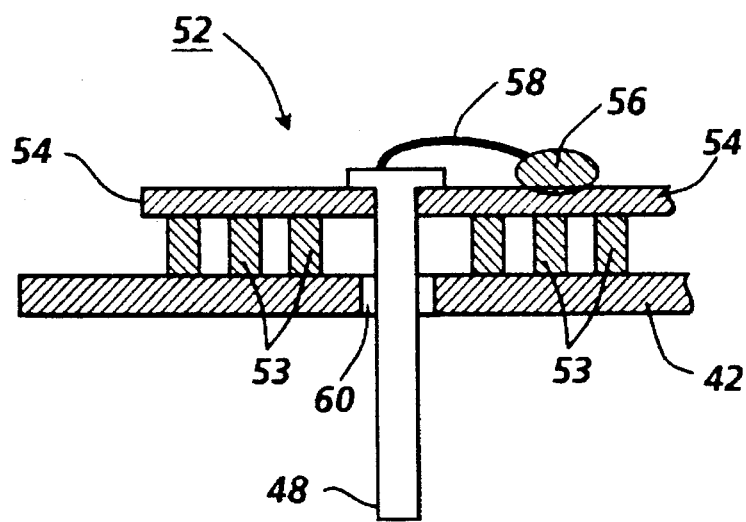
FIG. 2 is a cross section of the thermoelectric cooler and thermistor subassembly shown in FIG. 1 taken through cross-section line 2—2

In FIG. 1, the pins 48, 50 are soldered to a metallized pad on the cold side 54 of the thermoelectric cooler 52. The pins 48, 50 then pass through the metallized ceramic plate 42 without touching it, as shown in FIG. 2. An insulating gap 60 is left between ceramic plate 42 and pins 48, 50. The insulating gap 60 substantially reduces the thermal shorting between ceramic plate 42 and the pins 48, 50. The insulating gap 60 can be filled with any insulative material with a preference for a simple air gap as shown in FIG. 2.

This construction puts the lead wires 58 of the thermister 56 in physical contact with the cold side 54 of the thermoelectric cooler 52. This effectively eliminates the problem of the thermister 56 sensing not only the cold side temperature of the thermoelectric cooler 52 but also the higher ambient temperature through the thermal conduction of the pins 48, 50. Thermal loads from the ambient temperature through convection and radiation are still present, however, these thermal loads play a minor role compared to thermal conduction loads.

Figure 3:
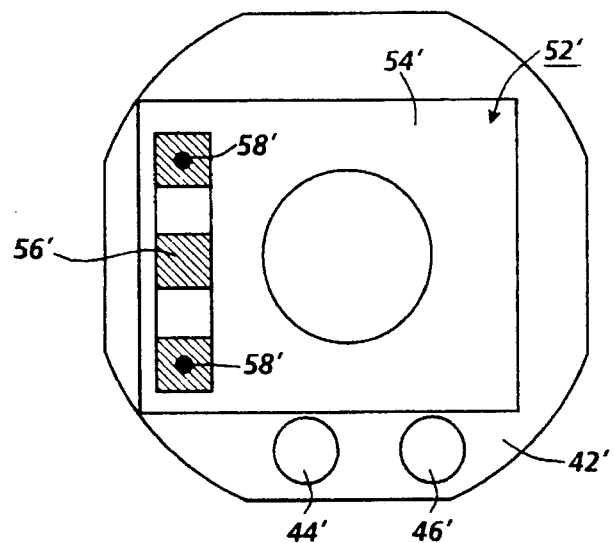
FIG. 3 is a top view of an alternate thermoelectric cooler and thermistor subassembly.

FIG. 3 shows an alternate embodiment of the same subassembly using a surface mounted thermister 56'. Parts in FIG. 3 that are the same as parts in FIG. 2 are given the same reference numeral with a prime designation (') appended.

The structure in FIG. 3 is very similar to the structure in FIG. 2 including a ceramic plate 42' with solid metal pins 44', 46' extending through the ceramic plate 42', and a thermoelectric cooler 52' with a cold side 54'. Attached to the cold side 54' of the thermoelectric cooler 52' is a thermister 56'. The pins 48, 50 shown in FIG. 2 are no longer needed since the thermister 56' is mounted directly on the cold side 54' of the thermoelectric cooler 52' via solder bumps 58'.

Figure 4:
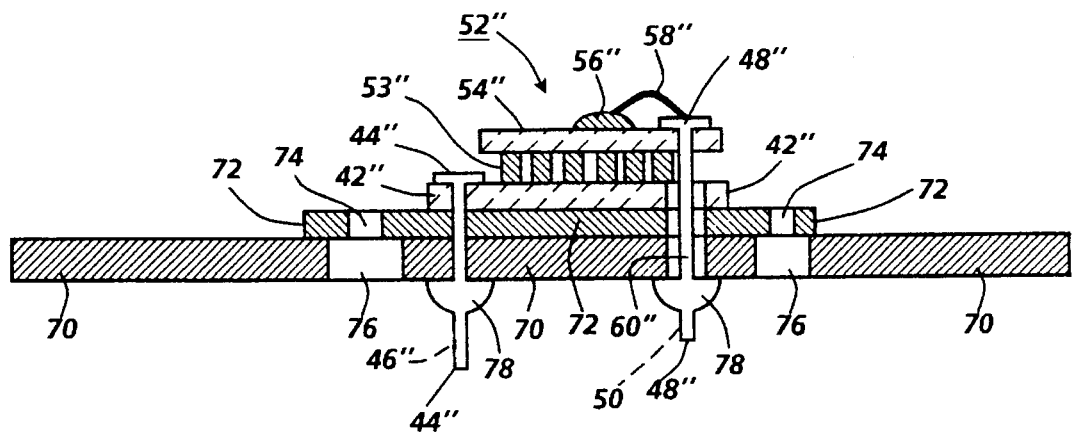
FIG. 4 is a cross section of the thermoelectric cooler and thermistor subassembly shown in FIG. 1 and attached to a printed circuit board.

FIG. 4 shows a third embodiment which mounts the subassembly of FIG. 2 onto a printed circuit board or other device. Parts in FIG. 4 that are the same as parts in FIG. 2 are given the same reference numeral with a double prime designation (") appended.

FIG. 4 shows a thermoelectric cooler 52" with its cold side 54" exposed. Attached to the cold side 54" is a thermister 56" with lead wires 58". The lead wires 58" are attached to pins 48", 50" (pin 50" not shown in FIG. 7). The pins 48", 50" extend through ceramic plate 42" as well as a circuit board 70 and heat sinking plate 72. Holes 74 are left in heat sinking plate 72 as well as holes 76 which are left in circuit board 70 so that an appropriate heat sink or housing may later be attached. The entire assembly is attached to the circuit board 70 by four solder joints 78, two of which are shown, between the pins 44", 46", 48", 50" and the circuit board 70.

I claim:

1. A thermoelectric cooler assembly comprising:

a) two spaced apart ceramic plates, one of said plates being a hot side, the other of said plates being a cool side, b) thermoelectric cooler elements interposed between said ceramic plates, c) two conductive pins, a thermistor input pin and a thermistor output pin, both of said pins attached to said cold side, said thermistor input pin and thermistor output pin having a given diameter and extending through said cold side, d) two openings in said hot side, said openings being of a diameter larger than the given dimension of said thermistor input pin and thermistor output pin, and e) said two conductive pins also extending through said hot side, said two conductive pins and said two openings being constructed and arranged with relative dimensions such that each one of said two conductive pins passes through its respective opening without contacting said hot side and is spaced from and not contacting the hot side other of said two conductive pins attached to said cold side and said hot side.

2. The thermoelectric cooler assembly of claim 1 further comprising a thermister having two lead wires, one lead wire being attached to said thermistor input pin and the other lead wire being attached to said thermister output pin.

3. The thermoelectric cooler assembly of claim 1 further comprising said thermister being bonded to one of said two spaced apart ceramic plates.

4. The thermoelectric cooler assembly of claim 3 where the one said two spaced apart ceramic plates is the cold side.

5. The thermoelectric cooler assembly of claim 1 wherein the gap between said one of said two conductive pins attached to said cold side and said hot side and the gap between said the other of said two conductive pins attached to said cold side and said hot side are both filled with insulative material.

\* \* \* \* \*